United States Patent
Alt et al.

(10) Patent No.: US 10,354,839 B2
(45) Date of Patent: *Jul. 16, 2019

(54) POWER SUPPLY SYSTEMS AND METHODS FOR GENERATING POWER WITH MULTIPLE AMPLIFIER PATHS

(71) Applicant: TRUMPF Huettinger GmbH + Co. KG, Freiburg (DE)

(72) Inventors: Alexander Alt, Freiburg (DE); Andre Grede, Bern (CH); Daniel Gruner, Muellheim (DE); Anton Labanc, Ehrenkirchen (DE)

(73) Assignee: TRUMPF Huettinger GmbH + Co. KG, Freiburg (DE)

( * ) Notice: Subject to any disclaimer, the term of this patent is extended or adjusted under 35 U.S.C. 154(b) by 0 days.

This patent is subject to a terminal disclaimer.

(21) Appl. No.: 16/025,030

(22) Filed: Jul. 2, 2018

(65) Prior Publication Data

US 2018/0323040 A1    Nov. 8, 2018

Related U.S. Application Data

(63) Continuation of application No. 15/185,290, filed on Jun. 17, 2016, now Pat. No. 10,026,593, which is a
(Continued)

(30) Foreign Application Priority Data

Dec. 18, 2013    (DE) .................. 10 2013 226 537

(51) Int. Cl.
  *H01J 37/32*    (2006.01)
  *H01L 29/78*    (2006.01)
  *H01L 29/417*    (2006.01)

(52) U.S. Cl.
  CPC .. *H01J 37/32174* (2013.01); *H01J 37/32082* (2013.01); *H01L 29/7835* (2013.01); *H01L 29/4175* (2013.01)

(58) Field of Classification Search
  None
  See application file for complete search history.

(56) References Cited

U.S. PATENT DOCUMENTS 5,162,745 A    11/1992  Koken
5,712,592 A    1/1998   Stimson et al.
(Continued)

FOREIGN PATENT DOCUMENTS

CN    101056495    1/2011
DE    9210382      11/1992
(Continued)

OTHER PUBLICATIONS

50V RF LDMOS: An ideal RF power technology for ISM, broadcast and commercial aerospace applications, freescale. com/RF power, Sep. 2011, 13 pages.
(Continued)

*Primary Examiner* — Dion Ferguson
*Assistant Examiner* — Srinivas Sathiraju
(74) *Attorney, Agent, or Firm* — Fish & Richardson P.C.

(57) ABSTRACT

A power supply system includes a power converter configured to generate a high-frequency power signal and be connected to a load to supply a plasma process or gas laser process with power. The power converter includes at least one amplifier stage having first and second amplifier paths each having an amplifier. The first and second amplifier path are connected to a phase-shifting coupler unit that is configured to couple phase-shifted output signals from the first and second amplifier paths to form the high-frequency power signal. At least one amplifier of the first and second
(Continued)

amplifier paths includes a field effect transistor implemented in a semiconductor device with a semiconductor structure having a substantially layered construction, and the semiconductor device includes a channel, a current flowing in the channel substantially in parallel with layers of the semiconductor structure.

20 Claims, 5 Drawing Sheets

Related U.S. Application Data continuation of application No. PCT/EP2014/077944, filed on Dec. 16, 2014.

(56) References Cited

U.S. PATENT DOCUMENTS

| | | | |
|---|---|---|---|
| 6,703,080 B2 | 3/2004 | Reyzelman et al. | |
| 6,703,808 B1 | 3/2004 | Blackburn et al. | |
| 6,803,629 B2 | 10/2004 | Tihanyi | |
| 7,745,955 B2 | 6/2010 | Kirchmeier et al. | |
| 7,782,133 B2 | 8/2010 | Bakalski et al. | |
| 7,862,681 B2 | 1/2011 | Choi | |
| 7,872,523 B2 | 1/2011 | Sivakumar et al. | |
| 8,421,377 B2* | 4/2013 | Kirchmeier | H01J 37/32045 315/291 |
| 8,462,883 B2* | 6/2013 | Mochizuki | H04L 27/36 375/297 |
| 8,482,205 B2* | 7/2013 | Kirchmeier | H01J 37/32045 315/111.21 |
| 8,535,941 B2 | 9/2013 | Hongo et al. | |
| 9,111,718 B2* | 8/2015 | Merte | H01J 37/32174 |
| 9,276,456 B2* | 3/2016 | Grede | H02M 7/53873 |
| 9,354,255 B2* | 5/2016 | Albrecht | G01R 33/3614 |
| 2002/0057610 A1 | 5/2002 | Baliga | |
| 2005/0255809 A1 | 11/2005 | Glueck | |
| 2007/0145900 A1 | 6/2007 | Kirchmeier et al. | |
| 2007/0281635 A1 | 12/2007 | Mccallister et al. | |
| 2008/0122369 A1 | 5/2008 | Nitschke | |
| 2009/0026181 A1* | 1/2009 | Kirchmeier | H01J 37/32045 219/121.54 |
| 2009/0026968 A1 | 1/2009 | Kirchmeier et al. | |
| 2010/0171427 A1* | 7/2010 | Kirchmeier | H01J 37/32045 315/111.21 |
| 2010/0171428 A1* | 7/2010 | Kirchmeier | H01J 37/32045 315/111.21 |
| 2010/0194476 A1* | 8/2010 | Drogi | H03F 1/0227 330/252 |
| 2012/0105166 A1* | 5/2012 | Darges | G01R 33/3607 332/145 |
| 2012/0200435 A1* | 8/2012 | Ngo | H03M 7/3073 341/61 |
| 2013/0038226 A1 | 2/2013 | Labanc | |
| 2013/0146973 A1* | 6/2013 | Mitra | H01L 29/7835 257/335 |
| 2013/0214680 A1* | 8/2013 | Kirchmeier | H01J 37/32045 315/50 |
| 2013/0222062 A1* | 8/2013 | Park | H03F 1/0227 330/251 |
| 2013/0231069 A1* | 9/2013 | Drogi | H04B 1/0475 455/114.3 |
| 2013/0241656 A1* | 9/2013 | Tajima | H03F 3/68 330/295 |
| 2013/0307055 A1 | 11/2013 | De Boet et al. | |
| 2014/0003000 A1* | 1/2014 | McPartlin | H01L 29/732 361/728 |
| 2014/0125315 A1* | 5/2014 | Kirchmeier | H01J 37/32045 324/76.52 |
| 2014/0327415 A1* | 11/2014 | Hoch | H01J 37/32183 323/237 |
| 2015/0287576 A1* | 10/2015 | Grede | H01J 37/32944 315/111.21 |
| 2015/0288274 A1* | 10/2015 | Grede | H02M 7/53873 315/111.21 |
| 2016/0277045 A1* | 9/2016 | Langer | H04B 1/0475 |
| 2016/0299548 A1* | 10/2016 | Grede | H01J 37/32174 |
| 2016/0300695 A1* | 10/2016 | Alt | H01J 37/32082 |

FOREIGN PATENT DOCUMENTS

| | | |
|---|---|---|
| DE | 10052004 | 2/2002 |
| DE | 102004024805 | 12/2005 |
| DE | 112008000120 | 10/2009 |
| DE | 102009039980 | 3/2010 |
| DE | 102012200702 | 6/2013 |
| DE | 102012223662 | 6/2014 |
| EP | 1783904 | 5/2007 |
| WO | WO 2009/012735 | 1/2009 |
| WO | WO 2009/012803 | 1/2009 |
| WO | WO 2009/012826 | 1/2009 |
| WO | WO 2009/012867 | 1/2009 |
| WO | WO 2009/012974 | 1/2009 |
| WO | WO 2012/023624 | 2/2012 |
| WO | WO 2013/076174 | 5/2013 |
| WO | WO 2013/146973 | 10/2013 |
| WO | WO 2015/091454 | 6/2015 |
| WO | WO 2015/091468 | 6/2015 |
| WO | WO 2016/089992 | 6/2016 |

OTHER PUBLICATIONS

Chinese Office Action in Application No. 201480069013.2, dated Jan. 9, 2018, 20 pages (with English translation).
Comet, "RF Generator: The Ultimate Solution for Demanding RF Plasma Processes". http://wwww.comet-pcl.com/.
Dissertation, CuvillierVerlag, Goettingen, 2012, 267 pages, English abstract on p. 7.
Draxler et al., "High Efficiency Envelope Tracking LDMOS Power AmplifierforW-CDMA", IEEE, manuscript received Mar. 10, 2006, 6 pages.
Freescale Semiconductor, "RF Power LDMOS Transistors: High Ruggedness N-Channel Enhancement-Mode Lateral MOSFETs", 2010-2013, 23 pages.
Gardner, Tau Ra, "Using RF Power Transistors in Industrial Applications", Freescale Semiconductor, Jul. 2009, 29 pages.
Gruner, Daniel, "HF-Liestungsverstaerker in modernen Silizium- und Verbindungshalbleiter-Technologien".
International Search Report for corresponding PCT Application No. PCT /EP2014/077919, dated Mar. 27, 2015, 8 pages.
International Search Report for corresponding PCT Application No. PCT/EP2014/077944, dated Feb. 26, 2015, 10 pages.
Leehmann, Thomas, "Sequential amplifier architectures for efficient power amplifiers", Dissertation, 2010, 133 pages.
Pritiskutch et al., "Understanding LDMOS Device Fundamentals", STMicroelectronics, Jul. 2000, 4 pages.
Products/RF-Generators, Aug. 24, 2012, 1 page.
STEVAL-TDR004V1, RF power amplifier demonstration board using two SD2933 N-channel enhancement-mode lateral MOSFETs, STMicroelectronics, Mar. 2010, 12 pages.
Theeuwen et al, "LDMOS Transistors in Power Microwave Applications", NXP Semiconductors, The Netherlands, 5 pages.
Office Action in German Application No. 102013226537.9, dated Jan. 23, 2019, 15 pages (with English translation).

* cited by examiner

POWER SUPPLY SYSTEMS AND METHODS FOR GENERATING POWER WITH MULTIPLE AMPLIFIER PATHS

CROSS-REFERENCE TO RELATED APPLICATIONS

This application is a continuation of and claims priority under 35 U.S.C. § 120 to U.S. patent application Ser. No. 15/185,290, filed on Jun. 17, 2016, which is a continuation of and claims priority to PCT Application No. PCT/EP2014/077944 filed on Dec. 16, 2014, which claims priority to German Application No. DE 10 2013 226 537.9, filed on Dec. 18, 2013. The contents of these priority applications are hereby incorporated by reference in their entireties.

TECHNICAL FIELD

The invention relates to power supply systems and methods for generating high-frequency power that can be supplied to a plasma process or a gas laser process.

BACKGROUND

Power supply systems, in particular systems which generate power at frequencies of >1 MHz and in particular less than 200 MHz and primarily in particular less than 90 MHz, are used for example for laser excitation or in plasma coating installations. Often, in power supply systems of this type, a plurality of amplifiers are used so as to generate a total power of the power supply system therefrom.

In a power supply system of this type, abrupt changes in the required power may occur, for example, if an arc occurs in the plasma chamber and the supplied power accordingly has to be reduced abruptly. On the other hand, the power required for igniting a plasma may be different from one for operating a plasma process. When the plasma state changes, so does the impedance of the load. This likewise results in an abrupt change in the load. It is often not possible to adjust the impedance sufficiently rapidly, and so the power is reflected by the load. The reflected power should, if possible, be kept away from the amplifiers or amplifier paths so as to prevent destruction or damage to the power supply system. It is known to use circulators to absorb the reflected power. However, in the stated frequency range, these circulators are very bulky and are no longer practical to use.

If abrupt load changes occur along with an abrupt change in the target power, the output power has to be controlled. This may be done for example by varying the input power of an amplifier. In the process, however, the efficiency of the amplifier also changes. At small output powers, the amplifier will operate in the back-off range. This is the range in which the amplifier only provides part of the maximum possible output power at the output. In this back-off range, the efficiency of the amplifier is reduced. Depending on the load to be operated, the transistor used in the amplifier therefore has to dissipate more lost power. It therefore becomes much warmer. In the event of mismatching, this behavior changes. Depending on the load angle or reflection angle, the transistor becomes warmer either in the back-off range or in the saturation range. It is therefore only possible to control the output power by way of the input power to a certain extent in the event of mismatching. To prevent the transistor from overheating, it has often been recommended to limit the maximum output power. However, lowering the maximum output power does not solve this problem, since, in the event of a major mismatching and an unfavorable load angle, critical temperatures occur even at low powers, not just at relatively high powers.

Thus far, a viable option has been to regulate the supply voltage of the transistor and in doing so to reduce it in such a way that it is possible to pass through the entire characteristic range at a reduced saturated power of the amplifier. If the voltage supply is too slow, the voltage supply has to remain set to relatively high voltages even at low output powers. In this case, sudden load changes may lead to excessive heating of the transistor in the amplifier.

SUMMARY

One aspect of the invention features a power supply system including a power converter which generates a high-frequency power signal and can be connected to a load to supply a plasma process or gas laser process with power. The power converter has at least one amplifier stage including a first and a second amplifier path each having an amplifier. The first amplifier path outputs a first amplifier path output signal at the output thereof, and the second amplifier path outputs a second amplifier path output signal at the output thereof which, with respect to the first amplifier path output signal, has a phase shift not equal to, in particular greater than, 0° and not equal to, in particular less than, 180°. The amplifier paths are connected to a phase-shifting coupler unit which couples the output signals of the amplifier paths to form a high-frequency power signal. At least one amplifier of the amplifier paths has a field effect transistor which is implemented in a semiconductor device of which the semiconductor structure is largely of a layered construction, in particular implemented in a planar semiconductor device which has a channel arranged in the semiconductor device, a current flowing in the channel mainly in the lateral direction, in other words substantially in parallel with the layers of the semiconductor structure. In particular, the semiconductor device can have a control terminal and a channel arranged below the control terminal in the semiconductor device, the current flowing in the channel below the control terminal mainly in the lateral direction, in other words substantially in parallel with the layers of the semiconductor structure.

The power supply system can supply a defined power to any load, and in particular any load can be operated even in the event of mismatching without the transistor being damaged by overcurrent, overvoltage or excessive lost power.

A semiconductor structure of a layered construction or a planar structure can be understood to be a structure which has a much smaller extension in one direction than in two directions orthogonal thereto. It may for example be rectangular parallelepiped, having a height much smaller than the width and depth dimensions. The planar semiconductor device thus has much smaller dimensions in a side view than in a view from above or below.

In this context, a lateral direction is understood as a direction substantially parallel to either the face of the planar extension, in other words in the above example the upper or lower face of the semiconductor device, or the layers of the semiconductor structure.

The semiconductor device may have a first and a second power terminal and a control terminal, all of the aforementioned terminals being arranged on a first face of the semiconductor device.

The semiconductor device can have a weakly negatively doped drift zone between a power terminal, in particular the drain terminal, and the control terminal (gate terminal) on the face of the semiconductor device facing the terminals. Said zone may in particular be larger than the width of the channel below the control terminal (gate terminal). The capacitance between the power terminals and the capacitance between the control terminal and the aforementioned power terminal (drain) can thus be kept low.

By means of the power supply system according to the invention, much greater power densities can be achieved in a transistor than for conventional transistors. Because of the lateral structure thereof, the transistors used have no parasitic elements. In particular, they have a lower capacitance between the control terminal (gate) and the first and second power terminal (source, drain), and also a lower parasitic capacitance between the two power terminals in the off state. The semiconductor device can therefore be made larger than semiconductor devices of conventional transistors. More semiconductor devices can be connected in parallel in a tightly packed manner.

By means of the power supply system according to the invention, much higher powers can be implemented in an amplifier. It is no longer necessary to use a plurality of amplifiers in an amplifier path. Instead, two amplifier paths each comprising an amplifier can be sufficient. In particular, a power of over 1000 W can be implemented in a single amplifier. This can be done without the components overheating even in the event of mismatching. The power supply system according to the invention operates much more stably than conventional power supply systems.

According to the invention, a phase-shifting coupler unit is understood to be a unit which has a coupler and optionally a phase-shifting network for each of one or more amplifier paths, wherein, during proper operation, the input signals of the coupler unit have a phase position with respect to one another which is not 0° and not 180° and in particular is greater than 0° and less than 180°. For example, the input signals may be phase-shifted by 90°. A coupler unit in which the input signals thereof have a phase shift of 0° or 180° with respect to one another is not considered to be a phase-shifting coupler unit within the meaning of the present invention, since in this case the input signals are merely added up without a further phase shift.

The phase-shifting coupler unit may be a 90° hybrid coupler. This meets the requirements in an optimal manner with minimum component outlay.

A phase-shifting coupler unit is also understood to be a unit which is configured to feed reflected power, which is conducted from the load through the coupler to the amplifiers, back to the amplifiers with a different phase. In the event of mismatching, a 90° hybrid coupler, to the input terminals of which two amplifiers of the same impedance are connected, for example divides the reflected power between the two amplifiers in a manner phase-shifted by 90°.

A phase-shifting coupler unit is also understood to be a unit which has a first input impedance at the first input terminal thereof and a second input impedance at the second input terminal thereof and which is configured in such a way that the input impedances are equal when no reflected power is being passed through the coupler unit to the input terminals and are different when reflected power is being passed through the coupler unit to the input terminals.

As described above, the coupler unit can be configured in such a way that it relays the power, reflected towards its output terminal, to its input terminals in a phase-shifted manner, and thus relays it to the amplifiers in the amplifier paths. The input impedances at the coupler unit can thus change and can in particular be different. This may result in the output impedance of the first amplifier taking on a different value from the output impedance of the second amplifier. This in turn may influence the properties of the coupler unit in such a way that it conducts the power of one amplifier to the other amplifier, so the amplifiers influence one another. The impedance of the amplifiers can become negative. In some load states, this may lead to the first amplifier in the first amplifier path supplying the second amplifier in the second amplifier path with power. In the past, these properties lead to the use of phase-shifting coupler units being discouraged. It was feared that the amplifiers would be brought into unstable states and/or the transistors would overheat.

Experiments using a high reflection factor have shown that the opposite is the case if the above-described transistor structure is used. The transistors heat up differently in the two amplifier paths, but in no load state is the maximum heating of the transistors as high as in power supply systems having coupler units of which the input signals have a phase difference of 0°. This may be related to the fact that, because of the lower values of the parasitic elements of the transistor, the impedance of the amplifier changes in precisely such a way that the transistors having the phase-shifting coupler unit heat up much less at the hottest point than without a phase-shifting coupler unit.

A more common reason for instability is the very rapid change in the impedance of the load, for example of the plasma process. The load change takes place so rapidly that neither an impedance matching network connected between the power supply system and the load, nor power regulation of the power supply system can react to the load change sufficiently rapidly. The rapid load change produces reflected power which is reflected into the amplifier. As described above, this changes the impedance of the amplifiers. Thus, after the rapid load change, the amplifiers no longer supply the same power as before the load change. However, in a power supply system comprising a phase-shifting coupler unit, in particular comprising a 90° hybrid coupler, the change in the power per change in the load state is much less than in a power supply system without a coupler unit of this type or having non-phase-shifting properties. Therefore, a power supply system comprising a phase-shifting coupler unit behaves more stably. However, the stabilization using the phase-shifting coupler unit alone has been found to still be insufficient. Only when the above-described transistor was used has the particularly high stability required for plasma processes been achieved whilst simultaneously preventing overloading of the transistors in mismatching states.

The advantage of using a phase-shifting coupler unit is that the two amplifier paths connected to the coupler unit experience different impedances in the event of mismatching. Moreover, in the event of mismatching, power is not fed back to the amplifier paths but can instead be dissipated into an absorption resistor. Because the amplifier paths experience different impedances, the transistors of the amplifiers are different temperatures in the event of mismatching, unlike in the case of same-phase combination, the hotter of the two transistors being heated by about 45% less, by comparison with the use of conventional combiners, even without regulation of the supply voltage.

One amplifier, in particular each amplifier, can have an output impedance at its output that is different from the input impedance of the coupler unit. In this case, the amplifier reflects the majority of the power conducted thereto back to the coupler unit, which then conducts the power into an absorption resistor. The advantage of a power supply system of this type is that the proportion of standing waves between the load and the amplifier is reduced. The frequently mentioned drawback of a power supply system of this type is that a lot of power is converted to heat in the absorption resistor and the resistor accordingly has to be made large and provided with good cooling. This would make a power supply system of this type expensive. However, the higher expense is compensated for by much higher stability and reliability.

One amplifier, in particular each amplifier, can be configured in such a way that the output impedance thereof changes when the impedance at which it supplies its power changes. This may for example be the case if reflected power is conducted to the amplifier. In particular, the input impedance of the coupler unit connected to the amplifiers may change if the load impedance connected to the output of the coupler unit changes.

Using the power supply system according to the invention, it is possible to operate the transistors both in saturation, in other words in the fully conductive state, and in compression, in other words with an amplification which falls with increasing input power, as well as at any point in the linear range of their characteristic curve. In particular, the transistors of the amplifiers can be operated in compression with a degree of compression greater than two. It is thus possible for the power supply system to supply a defined power to any desired load and thus even in the event of mismatching without heating beyond predetermined limits.

As an additional advantage, a power supply system comprising a phase-shifting coupler unit and the aforementioned transistor technology can be operated in the back-off range at higher supply voltages. It can thus be regulated more rapidly at small output powers, since the output power can be regulated by way of the input power. In addition, a phase-shifting coupler unit comprising an absorption resistor can be used for rapid pulsing between two output powers or for modulating the output power if the phases of the two amplifier paths are changed with respect to one another. In this case, part of the power flows not to the output of the power supply system, but instead to the absorption resistor.

For plasma processes, a high-frequency power signal modulated or pulsed at a modulation or pulsing frequency lower than the frequency of the high-frequency power signal is sometimes desired. This can be implemented particularly well using the power supply system. In particular, a phase-shifting coupler unit is advantageous for this purpose. To modulate or pulse the high-frequency power signal, the phase of the high-frequency signals between the amplifier paths can be adjusted by way of the modulation frequency or the pulse signal. In this way, particularly rapid pulsing or modulation is possible.

The advantage of using a field effect transistor is that it operates linearly and operates more stably at high frequencies. Because all the control terminals are implemented on the same face of the semiconductor device, said device can be connected in a simple manner. In particular, it can be chosen which of the terminals is passed directly onto the opposite face of the planar semiconductor device. If the terminal which is connected to earth when the transistor is operated as intended is passed to the opposite face, direct earthing of the terminal can be provided. By comparison with known high-frequency power MOSFET structures, for example a VDMOS structure, in which the drain terminal was usually arranged on the face facing the earth plane, this variant has the following advantages:

possibility of very good heat dissipation, because no electrical insulator has to be arranged between the earth plane and the power terminal;

low capacitive coupling between the power terminal, which is brought to rapidly alternating potential with respect to earth by the amplifier during proper operation of the transistor;

lower inductive load between earth and the power terminal, which is to be connected to earth when the amplifier is operated as intended.

It is thus possible to operate higher powers at higher frequencies on loads of which the impedance changes very rapidly, without overheating the transistors.

Moreover, it is possible to provide semiconductor devices of this type with a ceramics or plastics packaging. Furthermore, transistors of this type have a negative temperature coefficient at high currents, and so when the temperature of the transistor increases it is automatically regulated in such a way that the heat development therein is reduced. This increases the reliability of the transistors.

The amplifier paths may be identical in construction. This makes it possible to manufacture the power supply system in a particularly simple manner.

On the face of the semiconductor device opposite the first face, a power source terminal can be provided which is electrically conductively connected to the first power terminal through the semiconductor device. In particular, the source terminal can thus be laid on the rear face of the semiconductor device, resulting in simpler contacting. In particular, bonding wires for contacting the source terminal can be avoided, and so a terminal having lower inductance can be implemented.

The electrical connection of the first power terminal to the power source terminal on the opposite face within the semiconductor device can be implemented by way of a $p^+$-doped zone which extends from one face of the semiconductor device to the other face of the semiconductor device. By way of this highly doped zone, the electrical conductivity of the semiconductor device can be increased in this region. For p-doping, foreign atoms are introduced, for example implanted, and act as electron acceptors. To change the electrical conductivity in conventional silicon semiconductor components, elements of the third main group, such as boron, indium, aluminum or gallium, are used for p-regions. Silicon is the most commonly used base material for semiconductor components. A silicon crystal consists of tetravalent silicon atoms. The four valence electrons (outer electrons) of each silicon atom form four atomic bonds to the neighboring atoms and thus form the crystal structure. This turns all four electrons into bonding electrons. During the p-doping, trivalent elements, known as acceptors, are introduced into the silicon lattice and thus replace tetravalent silicon atoms. A trivalent element has three outer electrons available for atomic bonds. There is no outer electron for the fourth atomic bond in the silicon crystal. These electron gaps are referred to as holes or electron holes. When a voltage is applied, this hole behaves like a free-moving positive charge carrier, and can conduct current. An electron, driven by the external field, jumps out of an atomic bond, fills a hole and leaves a new hole behind. In silicon crystals, a $p^+$-doped (highly doped zone) refers to a ratio of at least one acceptor atom to $10^4$ silicon atoms.

The semiconductor device may have a lower face which is connected to an electrically conductive plate, the first layer of the lower face being $p^+$- or p-doped. As a result of this measure, a lower electrical resistance is implemented at the transition between the electrically conductive plate and the lower face of the semiconductor device.

The amplifier may comprise an LDMOS transistor. LDMOS stands for "laterally diffused metal oxide semiconductor". These are MOSFETs that have thus far been used primarily in the GHz range. During use in amplifiers to generate power which can be supplied to a plasma process, it has been found that these transistors using LDMOS technology behave much more reliably than comparable conventional MOSFETs. This can be attributed to a much higher current carrying capacity. In particular in tests using a plurality of amplifier paths at frequencies of 1 MHz to 200 MHz, in particular at 3.4 MHz, 13 MHz, 27 MHz, 30 MHz to 90 MHz and 162 MHz, these transistor types have demonstrated particularly high reliability. A further advantage of these transistor types over conventional MOSFETs is that the same transistors can be used for the stated frequencies (1 MHz to 200 MHz). Thus, it is now possible to use a very similar or even identical topology to construct amplifiers and power supply systems which can be used at frequencies over several decades in the range of 1 MHz to 200 MHz. These are frequencies often used in plasma processes and for gas laser excitation. Conventional MOSFETs operated at these frequencies in plasma processes often have problems if too much of the power supplied to the plasma process is reflected back. Therefore, the generated power often has to be limited so as not to allow the reflected power to exceed a critical limit. Thus, the plasma processes cannot always be ignited reliably or operated in the desired power range. Moreover, complex variable impedance adjustment circuits and combiners have been provided to overcome these drawbacks. It is now particularly advantageous to use LDMOS transistors when dealing with a high level of reflected power, as for example when supplying power to plasma processes. In connection with the aforementioned phase-shifting coupler unit, the advantage of the LDMOS transistors is that much higher reflected powers can be received by the transistors. As a result, the requirements on additional impedance matching networks connected between the power supply system and the load are lower, and the costs of components and regulation can be reduced in these impedance matching networks.

Between the amplifier and the coupler unit, the amplifier path can have an output network which has at least one planar inductor which is thermally and capacitively coupled via a dielectric to an earth plane through which coolant flows. By way of the output network, the output impedance of the amplifier path can be optimally adjusted to the input impedance of the coupler unit. Power losses can thus be prevented. Overheating can be prevented by arranging the planar inductor on an earth plane through which coolant flows.

The coupler unit can have a first and a second planar inductor, which are thermally and capacitively coupled via a dielectric to an earth plane through which coolant flows and are simultaneously capacitively and inductively coupled to one another. In this context, the inductors may have more than two windings and be formed without ferritic elements. The inductance can thus be kept low in a simple manner.

The planar inductors may have conductor path widths narrower than 15 mm. In this way, space can be saved and the capacitive coupling between the conductor paths and the earth can be kept low. In the case of a hybrid coupler, a plurality of conductor paths may be arranged in parallel in a plane. This increases the inductive coupling between the conductor paths, and no ferrites are required. The losses in the inductors can be reduced if no ferrite has to be arranged between the cooling body and the support material for the conductor paths.

A compact construction is achieved if the inductors of the coupler unit and the inductor of the output network are arranged at least in portions on a layer of a circuit board.

The inductors of the coupler unit may be arranged at least in portions in a plane, the planar semiconductor device of the transistor being arranged in the same plane or in a plane parallel thereto. In particular, the semiconductor device may be oriented in such a way that the channel in which the lateral current flows through the semiconductor device is oriented in the same plane or in a plane parallel thereto. As a result, couplings from the output to the input of the amplifier can be reduced.

The inductor of the output network may be arranged at least in portions in a plane, the planar semiconductor device of the transistor being arranged in the same plane or in a plane parallel thereto. In particular, the semiconductor device may be oriented in such a way that the channel in which the lateral current flows through the semiconductor device is oriented in the same plane or in a plane parallel thereto. As a result of the aforementioned measures, the coupling from one amplifier path to the other amplifier path can be reduced. This is important because the two amplifier paths are not in the same phase position. Shielding between the amplifier paths can thus be omitted. It is therefore possible for the two amplifier paths to be arranged on the same circuit board. This reduces production costs.

If an even higher power is to be generated, a plurality of amplifier stages may be provided, two amplifier paths of the amplifier stages being connected in each case to a phase-shifting coupler unit, in particular a 90° hybrid coupler, in particular directly without other coupling devices being connected therebetween.

At least one amplifier path can have a push-pull amplifier. It is thus possible to amplify each half wave of the signal to be amplified through its own transistor. As a result, the temperature of each amplifier is distributed over two transistors, and this results in an output signal having fewer harmonics than, for example, in a class E amplifier having only one transistor per amplifier or a plurality of transistors per amplifier that are connected in parallel with all of the terminals. A push-pull amplifier can be tuned better, because the harmonics generated thereby can be filtered more easily. It is additionally suitable for a wide frequency range.

An adjustable voltage supply may be provided, which is connected to the at least one amplifier and supplies it with a voltage. The voltage supply may in particular be a DC voltage supply, which can supply the amplifier with DC power or DC voltage. As a result of the voltage regulation, it is possible to react in particular to slow changes in the setpoint of the output power. As a result, the efficiency of the power supply system can be increased or kept high.

A regulation unit for regulating the voltage applied to the amplifier for the voltage supply can be provided. This regulation unit need not be implemented in the voltage supply. For example, the regulation unit may be implemented in a digital logic circuit which is connected to the voltage supply.

Measurement means for detecting or determining a reflection factor can be connected to the regulation unit.

An analog signal generated from a digital signal by a digital-analog converter (DAC) can be supplied to at least one amplifier path. It is thus possible to additionally carry out amplitude regulation. For amplitude regulation, a digital signal having information regarding the signal form and amplitude of the analog signal to be generated in the DAC can be generated in a simple manner. In particular, a sequence of digital values can be generated by a sequence of signal data values stored in a signal data memory being read out by means of a counter, and this sequence of signal data values being supplied to a multiplier and multiplied by means of this multiplier by an amplitude data value read out from an amplitude data memory. This is advantageous in particular if a plurality of analog signals are generated in parallel and subsequently combined by a coupler such that the signals to be coupled can be adjusted to one another in a particularly simple and rapid manner. Amplifier paths which are actuated using an analog signal thus generated are particularly suitable for parallel operation of a plurality of amplifier paths. The powers thus generated can be coupled at the output of the amplifier paths in a simple manner, resulting in a very rapid and tunable total power of the power converter. The load may be a plasma process or a gas laser process.

It is thus also possible to combine two regulation concepts, specifically amplitude regulation on the one hand and voltage regulation on the other hand. In plasma applications or laser excitation applications, preset profiles are typically followed. The required dynamic range (for the output power) and the moment at which the setpoint jumps are thus often known in advance. It is thus possible to use the two regulation concepts concurrently. Rapid changes in power can thus be implemented by way of the amplitude regulation. Subsequently, the voltage regulation can be readjusted and the efficiency can thus be increased. In particular when the output power is rapidly increased, care should be taken to select the voltage and amplitude in advance in such a way that a sufficient regulation range is reserved. For short, unplanned dynamic load processes, it is conceivable merely to use the rapid amplitude regulation, since the efficiency of the system can be neglected for short periods of time.

The amplifiers can be configured to convert power both in the linear range of the characteristic thereof and in saturation (compression). In this way, it is possible to cover wider power ranges than before.

The field effect transistor can have a control input, to which the driving voltage is connected via a capacitive dissipative circuit unit, which has a capacitive element comprising a resistor connected in parallel. As a result, undesired oscillations can be attenuated. The capacitive dissipative circuit unit may in particular be looped into the supply line to the gate in series.

A logic circuit unit for generating the digital signal supplied to the DAC may be connected upstream of the DAC, the logic circuit unit having a signal data memory in which signal data values for generating an analog signal form are stored. In particular, the logic circuit unit may additionally have an amplitude data memory, in which amplitude data values for influencing the amplitudes of the analog signals are stored, and a multiplier for multiplying the signal data values by the amplitude data values.

Another aspect of the invention features a method of exciting a plasma using high-frequency power, in which an analog signal is supplied to each of two amplifier paths and amplified into a high-frequency signal in the amplifier path by at least one amplifier, the high-frequency signals being supplied to a phase-shifting coupler unit which couples the high-frequency power signals in a phase-dependent manner, amplification being carried out in the at least one amplifier by means of a field effect transistor which is implemented in a semiconductor device of which a semiconductor structure is largely of a layered construction, in particular implemented in a planar semiconductor device which has a channel arranged in the semiconductor device, the current flowing in the channel mainly in the lateral direction, in other words substantially in parallel with the layers of the semiconductor structure.

The semiconductor device may have a first and a second power terminal and a control terminal, all of the aforementioned terminals being arranged on a first face of the semiconductor device.

High-frequency power can thus be generated much more stably than in the prior art. Moreover, higher powers can be implemented in a single amplifier. It is not necessary to connect a plurality of amplifier paths, in other words more than two amplifier paths, in parallel. A power of over 1000 W can be implemented in a single amplifier. There is no risk of the components overheating in the event of mismatching.

If the amplifier is supplied with an adjustable voltage, voltage regulation can be carried out.

In particular, the adjustable voltage can be adjusted by regulating a voltage for supplying the amplifier with power.

A reflection factor of the power reflected at the load can be detected, and the voltage can be regulated on the basis of the detected reflection factor, in particular the magnitude of the reflection factor. The power of the generator can thus be reduced on the basis of the magnitude of the reflection factor. The use of a (hybrid) coupler makes the voltage of the voltage supply required for a given minimum power virtually independent of the load angle or reflection angle. As a result, for a particular magnitude of the reflection factor, the voltage supply can be set to a virtually constant voltage.

Load points at which the transistors of the amplifier become warmer in the back-off range and load points at which the hottest point is at full power are offset by 180° in each case. The load points having the maximum temperatures are the points at which the hottest point is in saturation or compression. In principle, load points at which the hottest point is in the back-off range do not become as hot. This means that the amplifier having regulated voltage can be controlled independently of the load angle throughout the transfer curve.

The amplifier can thus be operated in the linear range of its characteristic curve and in saturation or compression, with a degree of compression greater than two. This results in a wider field of use of the amplifier.

In a first method step the magnitude of the reflection factor can be determined, and in a second method step the supply voltage for the amplifier can be set according to the magnitude of the reflection factor. In particular, the supply voltage for the amplifier can be set according to the magnitude of the reflection factor and the reflected power.

In the conventional method for exciting a plasma, the supply voltage had to be adjusted according to the load angle and the reflection factor so as to protect the transistors from overheating. Thus, the speed at which the output power was allowed to flow in the event of mismatching was limited to the speed at which the voltage of the supply voltage could be changed.

A third aspect of the invention features a high-frequency plasma arrangement comprising a plasma chamber in which at least one electrode is arranged and a power supply system according to the invention being connected to the electrode.

Further features and advantages of the invention will become apparent from the following description of an embodiment of the invention, by way of the drawings, which show details essential to the invention, and from the claims. The individual features may each be implemented in isolation or together in any desired combination in a variant of the invention.

A preferred embodiment of the invention is shown schematically in the drawings and is described in greater detail in the following with reference to the drawings, in which:

DETAILED DESCRIPTION

Figure 1:
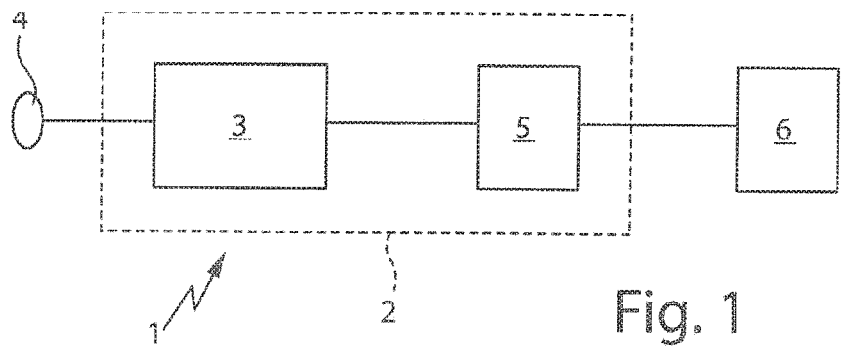
FIG. 1 is a highly schematic drawing of a plasma system comprising a power supply system.

FIG. 1 shows a plasma system 1 which comprises a power supply system 2. The power supply system 2 in turn comprises a power converter 3, which can be connected to a voltage supply network 4. The power generated at the output of the power converter is passed via an impedance matching network 5 to a load 6, which may for example be a plasma chamber in which a plasma is generated which can be used for plasma machining in the plasma chamber. In particular, a workpiece can be etched or a material layer can be applied to a substrate. The load 6 may also be a gas laser excitation.

Figure 2:
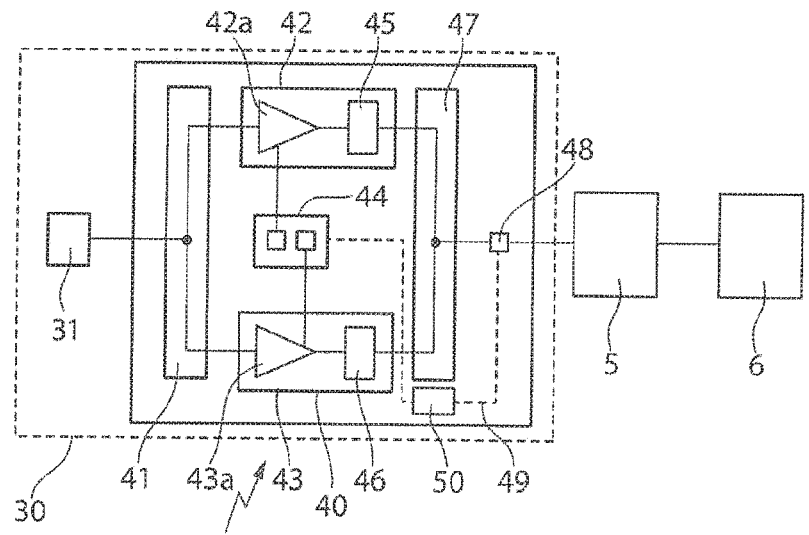
FIG. 2 is a block diagram of a power supply system.

FIG. 2 is a highly schematic drawing of a power supply system 20. The power supply system 20 has a power converter 30 which generates an output power which can be supplied to a load 6, for example a plasma process or a laser excitation. An impedance adjustment network 5 can be arranged between the load 6 and the power converter 30.

Figure 3:
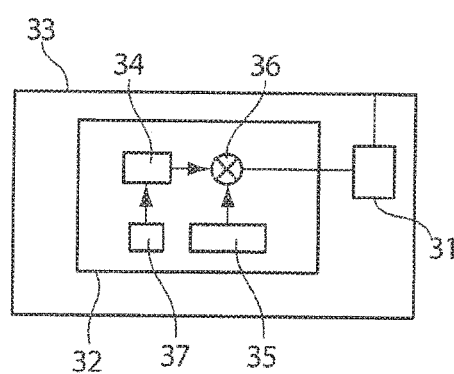
FIG. 3 is a block diagram of a direct synthesis module (DDS) module.

A digital-analog converter (DAC) 31 generates an analog output signal. The generation of the analog signal is explained on the basis of FIG. 3. A logic circuit unit 32 is assigned to the digital-analog converter 31. In particular, sequences of digital values from the logic circuit unit 32 are supplied to the DAC 31, from which sequences the DAC 31 generates an analog output signal. The DAC 31 and the logic circuit unit 32 can be integrated into a direct synthesis module (DDS module) 33, also known as a direct digital synthesizer. In this case, the logic circuit unit 32 comprises 1. a signal data memory 34, in which signal data values for generating the analog signal form are stored,
2. an amplitude data memory 35, in which amplitude data values for influencing the amplitude of the analog signals are stored,
3. a multiplier 36 for multiplying the signal data values by the amplitude data values, and
4. a counter 37, which ensures that signal data values are read out from the signal data memory 34 and supplied to the multiplier 36 in a predetermined clock cycle.

Both the signal data memory 34 and the amplitude data memory 35 can be in the form of lookup tables (LUTs).

As can be seen from FIG. 2, the generated analog signal is supplied to a first amplifier stage 40 and, therein, in particular to a splitter 41. The splitter 41 can be configured as a hybrid coupler which divides the analog signal into two phase-shifted signals, in particular signals phase-shifted by 90°, one signal emitted by the splitter 41 being supplied to each amplifier path 42, 43. The amplifier paths 42, 43 each have at least one amplifier 42a, 43a, it being possible for the amplifiers to be formed as push-pull amplifiers and thus each to have two transistors, in particular two LDMOS transistors. The voltage supply of the amplifier paths 42, 43, and thus of the amplifiers 42a, 43a and the transistors contained therein, is provided by way of a voltage supply 44. At the output of each amplifier path 42, 43, an output network 45, 46 is provided, said networks adapting the output impedances of the amplifiers 42a, 43a to the input impedance of a phase-shifting coupler unit 47 and simultaneously filtering undesired harmonics. In the phase-shifting coupler unit 47, the output signals of the amplifier paths 42, 43 are coupled in a phase-dependent manner to form an output signal, which is ultimately passed to the load 6 via an optional impedance adjustment network 5. Preferably, the phase-shifting coupler unit 47 is a 90° hybrid coupler.

The output power at the output of the coupler unit 47 can be detected by appropriate measurement means 47. The dashed line 49 indicates that the measurement means 48 are connected to a voltage regulation system 50, which in turn actuates the voltage supply 44. In particular, the measurement means 48 can also detect the power supplied to the load 6 and the power reflected by the load 6. From these values, a reflection factor or a magnitude of a reflection factor can be determined, and can in turn be used to regulate the voltage.

Figure 4:
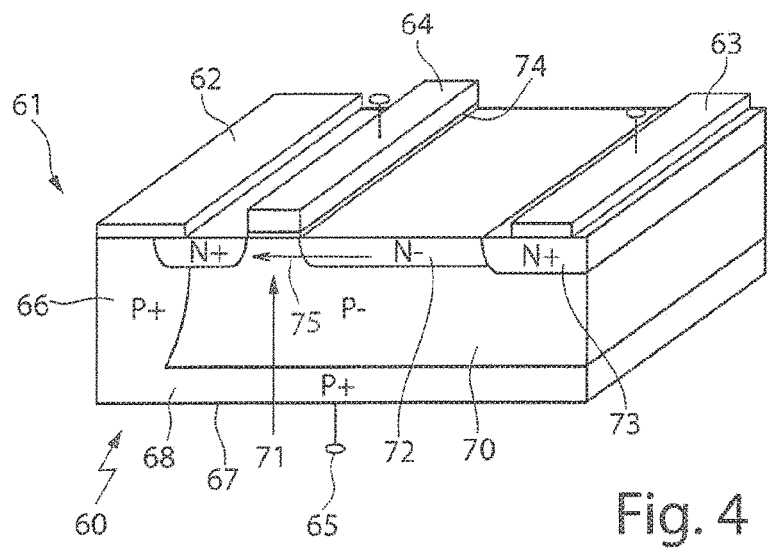
FIG. 4 is a schematic drawing of a LDMOS transistor.

FIG. 4 shows an LDMOS transistor 60 which can be used in an amplifier 42a, 43a of at least one of the amplifier paths 42, 43. The LDMOS transistor 60 is formed as a semiconductor device 61. On one face thereof, it comprises two power terminals 62 (source), 63 (drain) and a control terminal 64 (gate). The semiconductor structure of the semiconductor device 61 is largely of a layered construction, e.g., substantially a layered construction. The layers are strongly positively doped, such as the source layer 68, or weakly positively doped, such as the weakly positively doped layer 70, or weakly negatively doped, such as the weakly negatively doped drift zone 72. The layers define a planar structure of the semiconductor device 61. On the opposite face to the terminals 62, 63, 64, said module also has a power terminal 65 (source), which is electrically conductively connected to the power terminal 62 within the semiconductor device 61. The electrically conductive connection is provided via a p$^+$-doped region 66. In the region of the lower face 67 thereof, the transistor 60 has the likewise p$^+$-doped layer 70 as the bottom layer. The lower face 67 of the LDMOS transistor 60 can be connected to a cooling device, such that heat can be dissipated out of the LDMOS transistor 60 over a large area. The control terminal 64 (gate) controls the flow of current in the weakly p-doped layer 70 via the channel 71 from the drain 73 to the source 62. In the channel 71, the current preferably flows in a lateral direction, in other words substantially in parallel with the layers of the semiconductor structure, as indicated by the arrow 75. Between the drain 73 and the channel 71, there is a weakly doped n$^-$ zone, referred to as the drift zone 72. This keeps the capacitance between the source 65 and the drain 73 and the capacitance between the gate 64 and the drain 73 low. In the drift zone 72 in particular, the current also flows in a lateral direction, in other words substantially in parallel with the layers of the semiconductor structure. In this context, n⁺ represents high n-doping, p⁺ represents high p-doping, p⁻ represents weak p-doping, and n⁻ represents weak n-doping. Below the control terminal 64, a thin oxide layer 74 is provided. The transistor 60 is thus controlled by applying an appropriate voltage to the control terminal 64. The transistor 60 is thus controlled in terms of voltage. From the drawing of FIG. 4, it can further be seen that the transistor 60 is of an asymmetric construction, and power terminals 62, 63 for the drain and source and the control terminal 64 are arranged on the same face of the transistor 60.

The dimensions of the semiconductor device are preferably kept such that the thickness of the semiconductor device 61 is smaller than the wavelength of the signal to be amplified thereby by a factor of more than 200.

The width and/or depth of the semiconductor device 61 should advantageously be smaller than the wavelength of the signal to be amplified thereby by a factor of more than 20. Wavelength effects are thus insignificant in the semiconductor device 61, and also no undesirable harmonic oscillations occur at the harmonics of the signal to be amplified as a result of propagating waves in the semiconductor device 61. Moreover, the negative influences of the parasitic elements can thus be reduced. This arrangement can thus also be used effectively for pulsing and modulating the output voltage at pulsing and modulation frequencies of over 1 MHz.

The coupler unit 47, which is formed as or has a 90° hybrid coupler, also advantageously has dimensions such that the thickness of the coupler is smaller than the wavelength of the signal to be amplified thereby by a factor of more than 200.

The length of the lines of the 90° hybrid coupler 47 which are used for capacitively and inductively coupling the coupler is advantageously less than a tenth of the wavelength of the signal to be amplified thereby. This also helps to stabilize the power supply system 20.

Figure 5A:
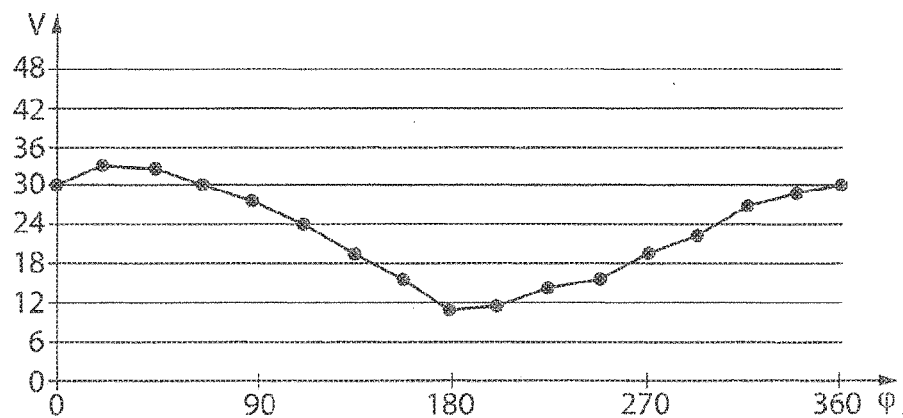
FIG. 5A shows a supply voltage of an amplifier for a constant output power and a varying load angle in accordance with the prior art.

FIG. 5A shows a supply voltage of a transistor 60 of an amplifier as a function of a load angle for amplifiers which are not coupled via a phase-shifting coupler unit, in particular not coupled via a 90° hybrid coupler. If a constant output power is to be maintained for a magnitude of 0.9 of the reflection factor, without the transistor overheating, the voltage has to be varied according to the load angle. As a result of the reduction in voltage, the maximum speed at which the output power can be controlled in the event of incorrect adjustment is also reduced. In particular, the speed of the adjustment is dependent on the speed at which the voltage supply can be regulated. If the regulation of the voltage supply is too slow, sudden load changes can lead to excessive heating of the transistor.

Figure 5B:
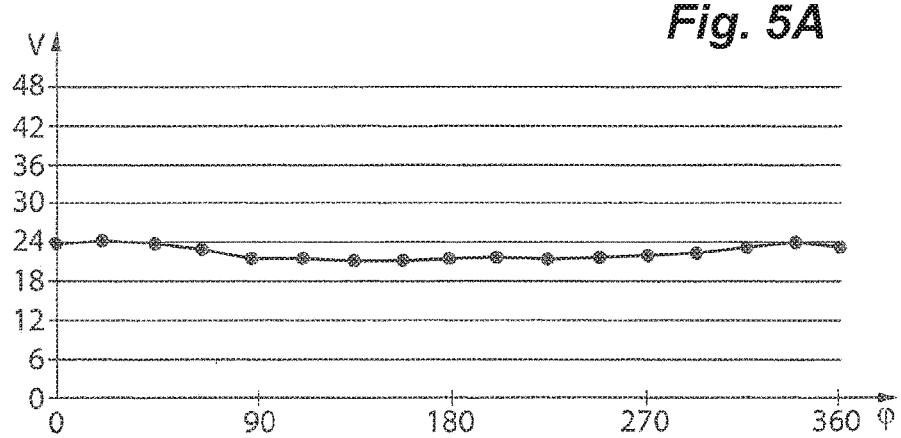
FIG. 5B shows a supply voltage of an amplifier for a constant output power and a varying load angle when a hybrid coupler is used.

By contrast, if the power is generated by means of two amplifier paths and these are coupled using a hybrid coupler, the result is the situation according to FIG. 5B. For a magnitude of 0.9 of the reflection factor, a constant output power can be kept virtually constant for all load angles. This means that the voltage of the voltage supply is virtually independent of the load angle. As a result, for a particular magnitude of the reflection factor, the voltage supply can be set to a constant voltage. The regulation speed is no longer dependent on the speed at which the voltage supply can be set.

Figure 6:
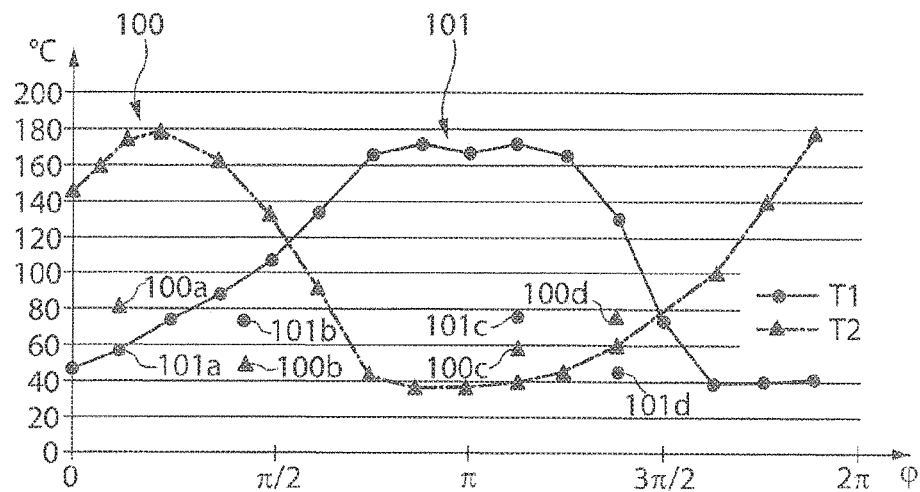
FIG. 6 shows a temperature of two transistors at a p-n transition as a function of a load angle.

FIG. 6 shows the temperature at the p-n transition in ° C. as a function of the load angle φ for two transistors T1, T2 in an amplifier 42a, 43a of an amplifier path 42, 43. In particular, the transistors T1, T2 form an amplifier in the form of a push-pull stage, which is operated using a 90° hybrid coupler as a coupler unit 47. The magnitude of the reflection factor is |Γ|=0.9 at all measurement points. For the curve 100, the transistor T2 is in saturation, and for the curve 101, the transistor T1 is in saturation. In saturation, the transistors reach temperatures of less than 180° C. The temperatures were also measured in the back-off range at particular load angles. Further points 100a, 100b, 100c, 100d show the highest temperatures reached by the transistor T2 in the back-off range in each case. Further points 101a, 101b, 101c, 101d show the highest temperatures reached by the transistor T1 in the back-off range in each case. For this purpose, however, the transistors were operated in a different power range from for the measurement in saturation, meaning that the temperature values are not directly comparable. Nevertheless, these measurements can be used to show that the transistors T1, T2 in the back-off range become hotter at some load angles than the transistors T1, T2 in saturation at the same load angle in each case. Overall, however, each transistor T1, T2 in the back-off range never becomes hotter than the associated hottest point in saturation. This means that the maximum temperatures are achieved when the transistors are in saturation. In the back-off range, however, the transistors do not become so hot. This could be achieved in this manner using the phase-shifting coupler unit 47, in particular the 90° hybrid coupler, and the above-described transistors in the amplifiers.

Figure 7:
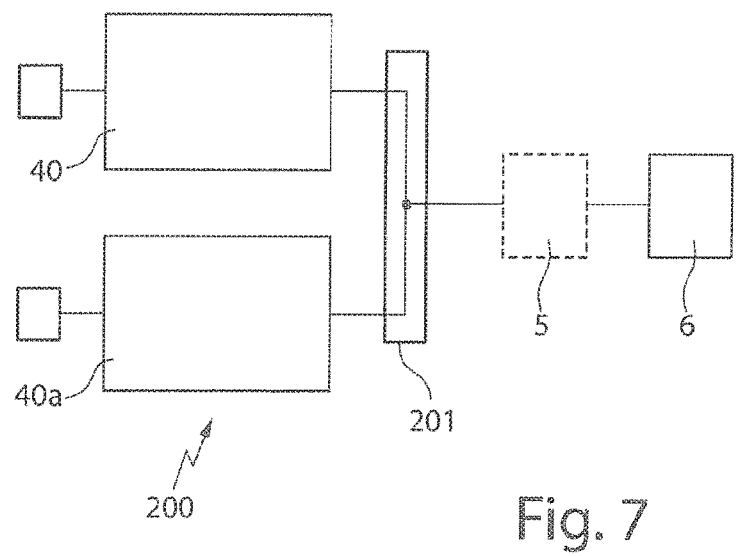
FIG. 7 is a schematic drawing illustrating coupling of a plurality of amplifier stages.

FIG. 7 schematically shows a power supply system 200 which has two amplifier stages 40, 40a, the amplifier stage 40 corresponding to the amplifier stage of FIG. 2 and it being possible for the amplifier stage 40a to have the same design. The outputs of the amplifier stages 40, 40a are in turn coupled via a coupler 201 to an output power which can be supplied to a load 6. The hybrid coupler of the amplifier stages 40, 40a and the coupler 201 are thus arranged in a cascaded manner. The coupler 201 may in turn be a phase-shifting coupler unit, in particular a 90° hybrid coupler. The coupler 201 may also be an in-phase coupler.

Figure 8:
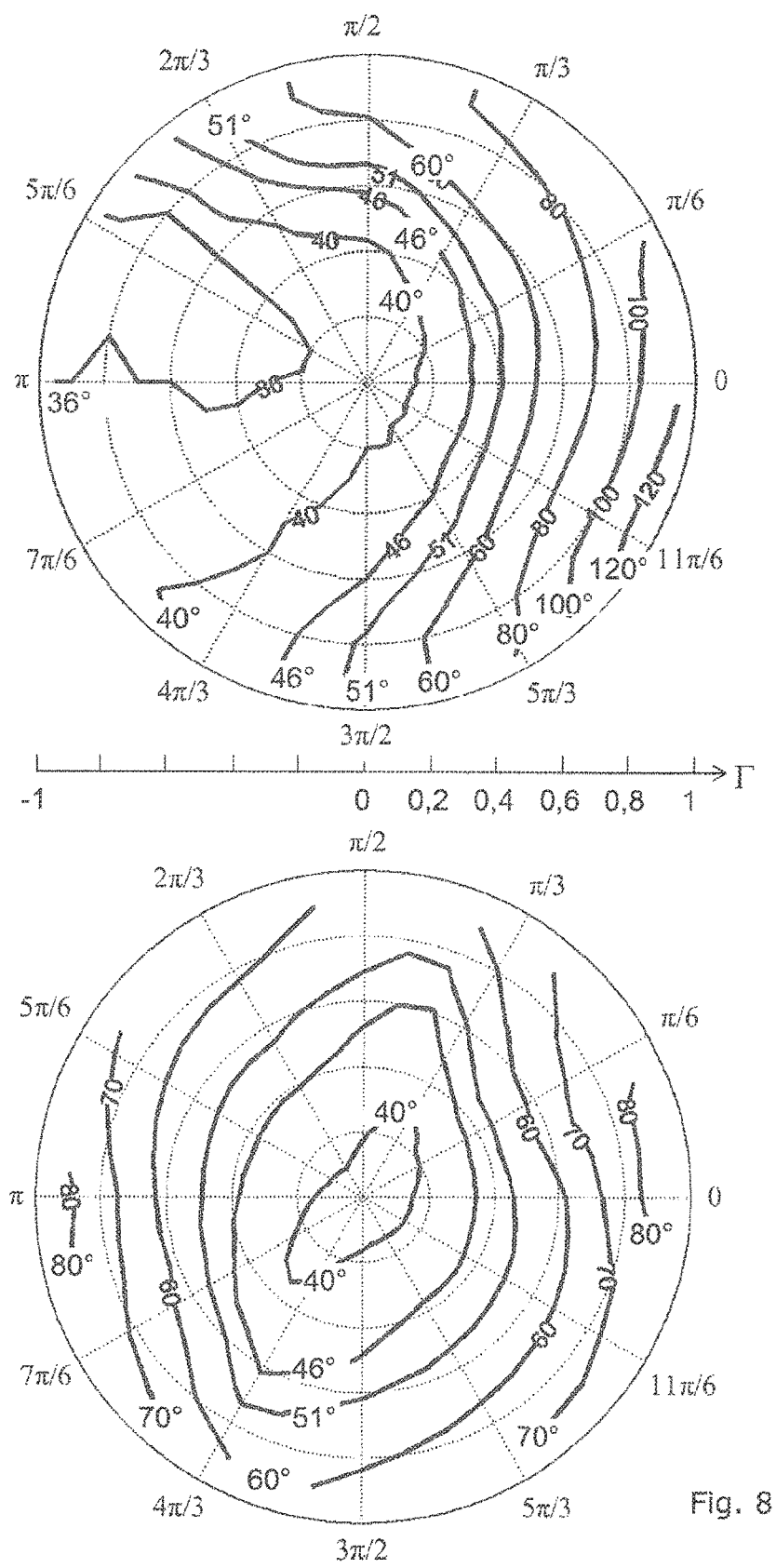
FIG. 8 shows two measurement results for temperatures of transistors as a function of s load point.

FIG. 8 shows two measurement results of the temperature curves of a semiconductor component 61 of a transistor T1, T2 of the power supply system 2, 20, 200 as a function of the load point for different mismatching, plotted against the complex reflection factor $\Gamma=|\Gamma|*e^{j\varphi}$. The scale for Γ from −1 to +1 applies to the real part of the upper and lower graphs. The angle φ of the reflection factor is plotted along the outer circle. For a set output power of the amplifier of 50Ω, the mismatching is set by changing the load and the temperature curve is shown. For the measurements, the transistors were operated in pulsed mode and only driven for 10% of the time, in order to be able to estimate the actual temperature for 100% driving without destroying the transistor.

The upper graph shows the temperature distribution for a power supply system 2 having a non-phase-shifting coupler unit. It can clearly be seen that the temperature can rise above 120° C. The lower graph shows the temperature distribution for a power supply system 20 having a 90° hybrid coupler. It can clearly be seen from this that the temperature only rises slightly above 80° C. This demonstrates the surprising advantage of the use of a phase-shifting coupler unit.

Figure 9:
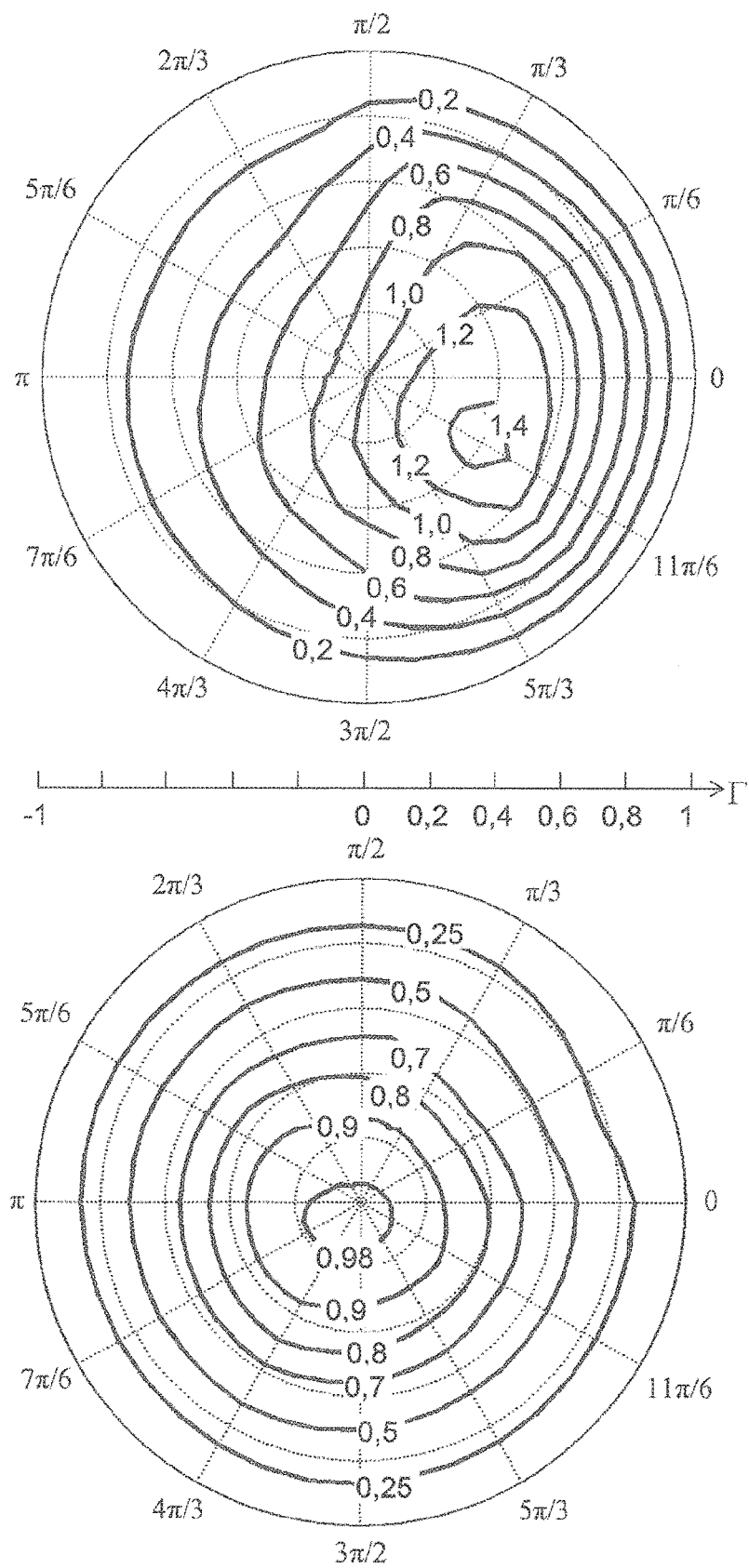
FIG. 9 shows two measurement results for an output power of a power supply system as a function of a load point.

FIG. 9 shows two measurement results of the output power of the power supply system as a function of the load point. In the two graphs, the output power, normalized to a power supplied to a 50Ω, is plotted against the complex reflection factor $\Gamma=|\Gamma|*e^{j\varphi}$. The angle φ of the reflection factor is plotted along the outer circle. For a set output power of the amplifier of 50Ω, the mismatching is set by changing the load and the resulting power is shown in the graphs. The upper graph shows the output power for a power supply system 2 having a non-phase-shifting coupler unit. It can clearly be seen that the maximum power is not being output at the 50Ω point in the center of the graph. In the event of mismatching in the direction φ=11π/6, a much higher power is output. This means that in the event of mismatching, the power may increase. In the event of rapid load changes, this may lead to instabilities. The lower graph shows the output power for a power supply system 20 comprising a 90° hybrid coupler. It can clearly be seen that the maximum power is being output at the 50Ω point in the center of the graph and that the power decreases slowly as the reflection factor increases. It also decreases much more slowly in the second graph. This can be seen from the wider spacing of the lines. This also makes the power supply system 20 comprising a 90° hybrid coupler much more stable. It can further be seen that the output power barely changes over the load angle. This means that if the magnitude of the reflection factor remains stable, the output power only changes by a very small factor over the load angle.

FIGS. 6, 8 and 9 show the angle φ of the reflection factor using radians, so as to ensure a clear distinction between angles and temperatures in the drawings. The temperatures are given in ° C., but only the unit ° has been incorporated into the drawings. The conversion from radians to degrees is generally known: π/2 corresponds to 90°, π corresponds to 180°, 3π/2 corresponds to 270°, and 2π corresponds to 360°.

A number of embodiments of the invention have been described. Nevertheless, it will be understood that various modifications may be made without departing from the spirit and scope of the invention. Accordingly, other embodiments are within the scope of the following claims.

What is claimed is:

1. A power supply system comprising:
a power converter configured to generate a high-frequency power signal and comprising:
at least one amplifier stage having first and second amplifier paths each having an amplifier, the first amplifier path outputting a first amplifier path output signal and the second amplifier path outputting a second amplifier path output signal that, with respect to the first amplifier path output signal, has a phase shift greater than 0° and less than 180°,
wherein the first and second amplifier paths are connected to a phase-shifting coupler unit that is configured to couple the first and second amplifier path output signals to form the high-frequency power signal,
wherein at least one amplifier of the first and second amplifier paths comprises a field effect transistor implemented in a semiconductor device with a semiconductor structure having a substantially layered construction,
wherein the semiconductor device comprises a channel, a current flowing in the channel substantially in parallel with layers of the semiconductor structure, and
wherein inductors of the phase-shifting coupler unit are arranged at least in portions in a plane, the semiconductor device with the transistor being arranged in the same plane or in a parallel plane.

2. The power supply system of claim 1, wherein the semiconductor device is oriented such that the channel in which the current flows through the semiconductor device is oriented in the same plane or in the parallel plane.

3. The power supply system of claim 1, wherein the inductors define a plurality of conductor paths that are arranged in the same plane or in a parallel plane.

4. The power supply system of claim 3, wherein the inductors comprise first and second planar inductors that are thermally and capacitively coupled via a dielectric to an earth plane through which coolant flows and are simultaneously capacitively and inductively coupled to one another, and
wherein the first and second planar inductors have conductor path widths narrower than a predetermined width, such that the capacitive coupling between the conductor paths and the earth plane is kept under a predetermined value.

5. The power supply system of claim 1, wherein the inductors have more than two windings and are formed without ferritic elements.

6. The power supply system of claim 1, wherein at least one of the amplifier paths has an output network between the corresponding amplifier and the phase-shifting coupler unit.

7. The power supply system of claim 6, wherein the output network has at least one planar inductor that is thermally and capacitively coupled via a dielectric to an earth plane through which coolant flows.

8. The power supply system of claim 6, wherein at least one inductor of the output network is arranged at least in portions in the same plane or in a parallel plane.

9. The power supply system of claim 6, wherein at least one inductor of the phase-coupling coupler unit and at least one inductor of the output network are arranged at least in portions on a layer of a circuit board.

10. The power supply system of claim 1, wherein dimensions of the semiconductor device are configured such that a thickness of the semiconductor device is smaller than a wavelength of a signal to be amplified by more than two orders of magnitude, and a width or a depth of the semiconductor device or both is smaller than the wavelength of the signal to be amplified by more than one order of magnitude.

11. The power supply system of claim 1, wherein the phase-shifting coupler unit comprises at least one coupler having a thickness smaller than a wavelength of a signal to be amplified by more than two orders of magnitude.

12. The power supply system of claim 1, wherein the phase-shifting coupler unit comprises at least one coupler having a line length smaller than a wavelength of a signal to be amplified by more than one order of magnitude.

13. The power supply system of claim 1, wherein the phase-shifting coupler unit comprises an absorption resistor configured for rapid pulsing between two output powers or for modulating an output power if phases of the first and second amplifier paths are changed with respect to one another.

14. The power supply system of claim 1, wherein the semiconductor device has a first power terminal, a second power terminal, and a control terminal that are arranged on a first face of the semiconductor device, and
wherein the power supply system further comprises a power source terminal arranged on a second face of the semiconductor device opposite to the first face and configured to be electrically conductively connected to the first power terminal through the semiconductor device.

15. The power supply system of claim 14, wherein the power source terminal is electrically conductively connected to the first power terminal by a heavily positively doped zone extending from the first face to the second face.

16. The power supply system of claim 1, wherein the semiconductor device has a weakly negatively doped drift zone between a power terminal and a control terminal on a face of the semiconductor device facing the terminals, and wherein the channel is below the control terminal, and a size of the weakly negatively doped drift zone is larger than a width of the channel.

17. The power supply system of claim 1, wherein at least one of the amplifiers is configured such that an output impedance of the at least one of the amplifiers changes when an impedance to which the at least one of the amplifiers supplies its power changes.

18. The power supply system of claim 1, wherein the transistor has a control input, to which a driving voltage is connected via a capacitive dissipative circuit unit that has a capacitive element including a resistor connected in parallel.

19. A power supply system comprising:
a power converter configured to generate a high-frequency power signal and comprising:
at least one amplifier stage having first and second amplifier paths each having an amplifier, the first amplifier path outputting a first amplifier path output signal and the second amplifier path outputting a second amplifier path output signal that, with respect to the first amplifier path output signal, has a phase shift greater than 0° and less than 180°,
wherein the first and second amplifier paths are connected to a phase-shifting coupler unit that is configured to couple the first and second amplifier path output signals to form the high-frequency power signal,
wherein at least one amplifier of the first and second amplifier paths comprises a field effect transistor implemented in a semiconductor device with a semiconductor structure having a substantially layered construction,
wherein the semiconductor device comprises a channel, a current flowing in the channel substantially in parallel with layers of the semiconductor structure,
wherein at least one of the amplifier paths has an output network between the corresponding amplifier and the phase-shifting coupler unit, and wherein at least one inductor of the phase-coupling coupler unit and at least one inductor of the output network are arranged at least in portions on a layer of a circuit board.

20. A high-frequency plasma system comprising:
a plasma chamber in which at least one electrode is arranged; and
a power supply system connected to the electrode and configured to supply high-frequency power to the electrode, the power supply system comprising:
at least one amplifier stage having first and second amplifier paths each having an amplifier, the first amplifier path outputting a first amplifier path output signal and the second amplifier path outputting a second amplifier path output signal that, with respect to the first amplifier path output signal, has a phase shift within a range from 0° to 180°,
wherein the first and second amplifier path are connected to a phase-shifting coupler unit that is configured to couple the first and second amplifier path output signals to form the high-frequency power signal,
wherein at least one amplifier of the first and second amplifier paths comprises a field effect transistor implemented in a semiconductor device with a semiconductor structure having a substantially layered construction,
wherein the semiconductor device comprises a channel, a current flowing in the channel substantially in parallel with layers of the semiconductor structure, and
wherein inductors of the phase-shifting coupler unit are arranged at least in portions in a plane, the semiconductor device of the transistor being arranged in the same plane or in a parallel plane.

* * * * *